US006888751B2

(12) United States Patent
Makuta et al.

(10) Patent No.: US 6,888,751 B2
(45) Date of Patent: May 3, 2005

(54) NONVOLATILE SEMICONDUCTOR MEMORY DEVICE

(75) Inventors: Kiichi Makuta, Kodaira (JP); Akihiro Fujita, Kokubunji (JP); Hideo Kasai, Musashino (JP); Masashii Wada, Kodaira (JP); Atsushi Toukairin, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/364,342

(22) Filed: Feb. 12, 2003

(65) Prior Publication Data

US 2003/0117847 A1 Jun. 26, 2003

Related U.S. Application Data

(60) Continuation of application No. 10/198,996, filed on Jul. 22, 2002, now Pat. No. 6,556,479, which is a division of application No. 09/984,224, filed on Oct. 29, 2001, now Pat. No. 6,480,415.

(30) Foreign Application Priority Data

Nov. 9, 2000 (JP) .......................................... 2000-342454

(51) Int. Cl.[7] .............................................. G11C 16/04
(52) U.S. Cl. ............................. 365/185.09; 365/185.11; 365/185.23
(58) Field of Search ....................... 365/185.09, 185.11, 365/185.23

(56) References Cited

U.S. PATENT DOCUMENTS

| 5,561,627 | A | | 10/1996 | Matsubara et al. | .... 365/185.04 |
| 5,566,109 | A | * | 10/1996 | Matsubara | ............. 365/185.08 |
| 5,808,944 | A | | 9/1998 | Yoshitake et al. | ...... 365/185.09 |
| 6,259,639 | B1 | | 7/2001 | Hashizume | ................... 365/200 |
| 6,301,152 | B1 | * | 10/2001 | Campardo et al. | ..... 365/185.09 |
| 6,331,945 | B1 | | 12/2001 | Shibata et al. | ........ 365/185.18 |
| 6,331,949 | B1 | | 12/2001 | Hirano | .................. 365/185.09 |
| 6,570,790 | B1 | * | 5/2003 | Harari | .................... 365/185.09 |

FOREIGN PATENT DOCUMENTS

JP        11-297086        10/1999

* cited by examiner

Primary Examiner—Huan Hoang
(74) Attorney, Agent, or Firm—Miles & Stockbridge P.C.

(57) ABSTRACT

A nonvolatile semiconductor memory device includes a memory array which comprises a plurality of memory cells of a type wherein predetermined voltages are applied to selected memory cells to change their threshold voltages, whereby information are stored therein according to the difference between the threshold voltages, and whose some memory cells are used as spare memory cells. The nonvolatile semiconductor memory device is provided with a latch circuit connected to each bit line of the memory array through a transmission switch. The memory array is capable of storing therein at least substitutional information for replacing a defective bit by the spare memory cell. The substitutional information is transferred from the memory array to the latch circuit through the transmission switch and held in the latch circuit.

8 Claims, 11 Drawing Sheets

NONVOLATILE SEMICONDUCTOR MEMORY DEVICE

CROSS-REFERENCE TO RELATED APPLICATIONS

This application is a continuation of application Ser. No. 10/198,996 filed Jul. 22, 2002, now U.S. Pat. No. 6,556,479 which is a division of application Ser. No. 09/984,224 filed Oct. 29, 2001 (now U.S. Pat. No. 6,480,415 issued Nov. 12, 2002).

BACKGROUND OF THE INVENTION

The present invention relates to a technology effective for application to a method of setting redundancy relieving information and trimming information such as a voltage employed in an electrically programmable erasable nonvolatile memory, and to a technology effective for use in a flash memory, for example.

In a flash memory, nonvolatile storage or memory elements comprising MOSFETs formed in a two-layer structure having control and floating gates are used for memory cells. The amount of an electrical charge stored in the floating gate is changed to vary the threshold voltage of each MOSFET, thereby storing data in each memory cell.

This type of flash memory is generally provided with an internal power circuit having a booster circuit like a charge pump circuit for generating high voltages necessary for write/erase operations for each memory cell. However, the booster circuit causes predetermined variations even in the generated voltages due to variations in elements constituting the booster circuit. Even as to the MOSFETs constituting the storage elements of the flash memory, parameters such as the thickness or the like of a gate oxide film, the size of each portion of an element, the concentration of an impurity in a drain region, etc. vary due to the difference in process or the like, and correspondingly, a write characteristic and an erase characteristic vary in a predetermined range.

When the voltages generated by the booster circuit and the write and erase characteristics of each storage element vary as described above, the accurate operation of the memory is not assured. Therefore, there is known a technology wherein a trimming circuit is provided to make fine adjustments to each generated time and a write time at a stage subsequent to the fabrication of a chip. A general semiconductor memory including a flash memory is provided with a so-called redundant circuit for replacing a defective bit included in a memory array with its corresponding spare memory cell to improve the yield thereof.

It was conventionally common practice to adopt a system wherein the level setting of the trimming circuit and the setting of substitutional information by the redundant circuit were carried out by using a fuse (hereinafter called "polysilicon fuse") formed of a polysilicon layer. However, the system using the polysilicon fuse needs a device for breaking or cutting off the polysilicon fuse by laser or the like. Since the subsequent change is unfeasible once it cuts off, the greatest possible care is required upon its cutting-off. A problem also arises in that trimming cannot be performed after the assembly of chips into packages. Therefore, there has also been proposed the invention related to a trimming circuit or a redundant circuit wherein elements identical in structure to nonvolatile storage or memory elements constituting a memory array, which are used in place of the polysilicon fuse, have been used in place of the polysilicon fuse.

SUMMARY OF THE INVENTION

However, the system using the nonvolatile memory elements in place of the polysilicon fuse is accompanied by the problem that since a memory element for a fuse is normally provided independently of a memory array, a dedicated circuit for effecting writing, verify, etc. on the memory element is needed to make circuit's overhead greater, thereby increasing a chip size.

Therefore, the invention has also been proposed wherein a switching element is used in place of the polysilicon fuse, a trimming register for holding trimming information for controlling the switching element is provided and a relieving register for storing substitutional information therein is provided, and the trimming information and substitutional information are stored in a predetermined area lying within a memory array, whereby the information are read from the memory array upon resetting and set to the trimming register and relieving register (Unexamined Patent Publication No. Hei 11(1999)-297086).

However, the prior invention does not make it appear that in which area of the memory array the registers for the trimming information and relief should be stored. When one attempts to store the registers in a normal use area, a problem arises in that storage capacity available for a user is reduced. Further, there is a possibility that the user will accidentally rewrite data written into the trimming information storage area. A problem arises in that when the trimming information is rewritten or updated, the normal operation of a memory is not assured. Further, the registers for the trimming information and relief are provided in a controller, and the information is transferred to each register according to a normal read operation.

An object of the present invention is to make it possible to effect writing, verify, etc. on memory elements for storing trimming information and substitutional information or the like without the provision of a dedicated circuit in an electrically programmable erasable nonvolatile memory device like a flash memory.

Another object of the present invention is to make it possible to avoid a reduction in storage capacity available for a user and misrewriting of data by the user.

The above, other objects, and novel features of the present invention will become apparent from the description of the present specification and the accompanying drawings.

Summaries of typical ones of the inventions disclosed in the present application will be described in brief as follows:

Substitutional information for a redundant circuit and adjustment information for a voltage trimming circuit are stored in some of a memory array, and these information are transferred to a latch circuit or a register upon power-up or the like.

Described more specifically, there is provided a nonvolatile semiconductor memory device comprising a memory array comprising a plurality of memory cells wherein which predetermined voltages are applied to selected memory cells to change threshold voltages thereof, thereby storing data therein according to the difference between the threshold voltages. In the nonvolatile semiconductor memory device, some in the memory array are used as spare memory cells, and at least one latch circuit connected to each bit line of the memory array through a transmission switch is provided. The memory array is capable of storing therein at least substitutional information for replacing a defective bit by the spare memory cell. The substitutional information is capable of being transferred from the memory array to the latch circuit through the transmission switch and held in the latch circuit.

According to the above means, since the substitutional information for the redundant circuit is originally stored in the part of the memory array, it is not necessary to use the polysilicon fuse. It is therefore possible to flexibly set substitutional information and trimming information for each memory cell and effect writing, verify, etc. on each memory or storage element for storing the substitutional information or the like therein without using a dedicated device or providing a dedicated circuit.

Preferably, the memory array includes a set value storage area whose access is restricted in a normal operating state and which is configured writably in a predetermined operation mode, and the substitutional information is capable of being stored in the set value storage area. Thus, the storage capacity available for each user is not reduced. It is also possible to avoid miswriting of the substitutional information or the like by the user.

Further, the substitutional information stored in the memory array is transferred to and held in the latch circuit through the transmission switch upon power-up. It is thus possible to bring the substitutional information into a state of being held in the latch circuit when the normal operation is allowed.

The latch circuit has a positive-phase and a negative-phase input terminals. The pair of input terminals are connected to any two bit lines of the memory array, and the latch circuit captures memory information, based on complementary data stored in at least two memory cells connected to the two bit lines and holds the same therein. Thus, since the latch circuit is capable of capturing data to be held therein according to the differential, the reliability of the held data is enhanced.

The transmission switch may preferably be configured so that it is brought into conduction according to a reset signal supplied upon power-on to thereby allow the substitutional information stored in the memory array to be transferred to and held in the latch circuit. In the nonvolatile semiconductor memory device like the flash memory, there might be provided a terminal for inputting a reset signal from outside. Therefore, the substitutional information is transferred to and held in the latch circuit according to such an external reset signal, whereby it becomes unnecessary to provide any new circuit and terminal for the purpose of controlling the transmission switch.

A power-on reset circuit which detects the rising edge of a source voltage to generate a reset signal, is further provided. The transmission switch may be configured so as to be brought into conduction according to the reset signal generated by the power-on reset circuit. Thus, the substitutional information can be transferred to and held in the latch circuit before the supply of the reset signal from the outside. Further, even if the system is configured so as not to input the reset signal to the semiconductor memory device, the substitutional information can be transferred to and held in the latch circuit.

Furthermore, there are provided an internal power circuit which generates voltages used to write data into each memory cell in the memory array and erase the same therefrom, and a trimming circuit which adjusts the level of each of the voltages generated by the internal power circuit. Adjustment information for the trimming circuit and the substitutional information are stored in the memory array and transmitted to the latch circuit through the transmission switch. Thus, even when the adjustment information for the trimming circuit is set, the use of the polysilicon fuse is not necessary. Therefore, it is possible to improve the reliability and effect writing, verify, etc. on each memory element for storing the adjustment information or the like without using a dedicated device or providing a dedicated circuit.

A plurality of memory cells are respectively connected to respective bit lines in the set value storage area, the same data is stored in a plurality of memory cells connected to the same bit line, and the latch circuit determines and holds data, based on signals read from the plurality of memory cells having stored the same data therein. Thus, the set information held in the latch circuit is determined based on the information stored in the plural memory cells, and hence the reliability of the data held in the latch circuit is enhanced.

Further, the plurality of memory cells connected to the same bit line are respectively connected to discrete selection signal lines. A decoder is provided which selectively drives these selection signal lines. The selection signal lines are sequentially respectively driven to a selected level to thereby write data into memory cells in the set value storage area in turn. The information stored in the plurality of memory cells connected to the same bit line are simultaneously transferred to the latch circuit according to the simultaneous driving of the selection signal lines to the selected level. The nonvolatile semiconductor memory device generally needs much currents upon writing rather than upon reading. However, the writing is carried out in turn while the selection signal lines are sequentially selected, as described above, whereas the reading is collectively carried out. Thus, the current supply capacity of the internal power circuit need not increase as compared with the prior art, and the reading can be performed in a short time.

Furthermore, there is provided an external terminal to which a reset signal supplied from outside is inputted. The transmission switch is brought into conduction based on the reset signal generated by the power-on reset circuit or the reset signal inputted from the external terminal to thereby allow the data stored in the set value storage area to be transferred to and held in the latch circuit. Thus, since the data stored in the set value-storage area can be transferred to and held in the latch circuit according to the reset signal supplied from outside and the internally-generated reset signal, the reliable transfer of data is enabled.

The latch circuit is provided with a switch element for allowing the setting of predetermined data for testing. When any information is not written into each memory cell, the state of the memory cell becomes instable and data to be transferred to the latch circuit is also unspecified. Therefore, while the test per se cannot be performed, predetermined information can be set to the latch circuit so as to allow entrance into a test operation. Based on the above result of test, the substitutional information and adjustment information may be written into the memory cells.

According to another invention of the present application, there are provided a memory array which comprises a plurality of memory cells in which predetermined voltages are applied to selected memory cells to change threshold voltages thereof, thereby storing data therein according to the difference between the threshold voltages, and which is provided with spare memory cells, and a latch circuit connected to bit lines of the memory array through a transmission switch. At least substitutional information for replacing a defective bit with the spare memory cell is stored in the memory array. In a nonvolatile semiconductor memory device wherein the substitutional information is transferred from the memory array to the latch circuit through the transmission switch and held in the latch circuit, writing and reading are effected on the memory array in a wafer state to detect a defective bit, and substitutional information for replacing the detected defective bit with the spare memory cell is written into a predetermined memory cell of the memory array. Thereafter, the wafer is cut every nonvolatile semiconductor memory device chips and they are encapsulated into packages respectively. Writing and reading are further effected on the memory array in the package state to detect a defective bit. Substitutional information for replacing the detected defective bit with the spare memory cell is written into a predetermined memory cell of the memory array, and the normally-written memory cell is extracted. Thus, the conventionally-unfeasible relief subsequent to package assembly is enabled and the yield of each product is improved.

Preferably, the substitutional information written into the memory cell can be read into the outside. Upon the writing of the substitutional information into the memory array in the package state, the substitutional information already written into the memory array is read and merged with substitutional information related to a newly-detected defective bit to obtain information, and the resultant information can be written into a predetermined memory cell of the memory array. Thus, it is not necessary to store the substitutional information written in the wafer state till after the assembly of each package. Further, there is no possibility that information about another product will accidentally be written due to mis-data management.

Further, in the nonvolatile semiconductor memory device including an internal power circuit which generates voltages used to write data into the memory array and erase the same therefrom, and a trimming circuit which adjusts the level of each of the voltages generated by the internal power circuit, each of the voltages generated by the internal power circuit is detected in both the wafer state and package state to determine adjustment information used for the trimming circuit. The adjusting information for the trimming circuit is written into the set value storage area together with the substitutional information. Thus, even when the adjustment information for the trimming circuit is set, the conventionally-unfeasible adjustment subsequent to the assembly of each package is allowed and hence the yield of each product is enhanced and the performance thereof such as a write time is improved.

A further invention of the present application provides a nonvolatile semiconductor memory device comprising a memory array which comprises a plurality of memory cells in which predetermined voltages are applied to selected memory cells to change threshold voltages thereof, thereby storing data therein according to the difference between the threshold voltages, and which is provided with spare memory cells, and a sense amplifier array which amplifies the potential of each bit line lying within the memory array. In the nonvolatile semiconductor memory device, a pad array used for input/output of write data and read data of the memory array is disposed along one side of a semiconductor chip with the memory array formed thereon. A latch circuit array is disposed between the data input/output pad array and the memory array. The latch circuit array is connected to the bit lines of the memory array through a transmission switch. Substitutional information stored in the memory array, for replacing the defective bit of the memory array with the spare memory cell is transferred to and held in the latch circuit array via the transmission switch. Further, a distribution circuit is disposed between the latch circuit array and the data input/output pad array and adapted to distribute write data to the sense amplifier array and distribute data read from each sense amplifier to each of pads. Thus, wiring routing can easily be performed between the memory array and the latch circuit array and between the latch circuit array and the distribution circuit.

Preferably, a set value storage area for storing the substitutional information is provided on the latch circuit array side of the memory array. Thus, the distance between the set value storage area for storing the substitutional information and the latch circuit array to which the substitutional information is transferred and which holds it therein, becomes short, and the information can accurately be transferred even upon power-up or the like.

Further, the memory array comprises a plurality of banks. Sense amplifier arrays are respectively disposed between any two banks, and the latch circuit array and distribution circuit are placed between the bank closest to the data input/output pad array, of the banks and the data input/output pad array. Thus, even when the sense amplifier arrays are provided in plural form, the latch circuit arrays and distribution circuits can easily be placed collectively at one point, and the size of the chip can be reduced.

DETAILED DESCRIPTION OF THE PREFERRED EMBODIMENTS

Preferred embodiments of the present invention will hereinafter be described with reference to the accompanying drawings.

Figure 1:
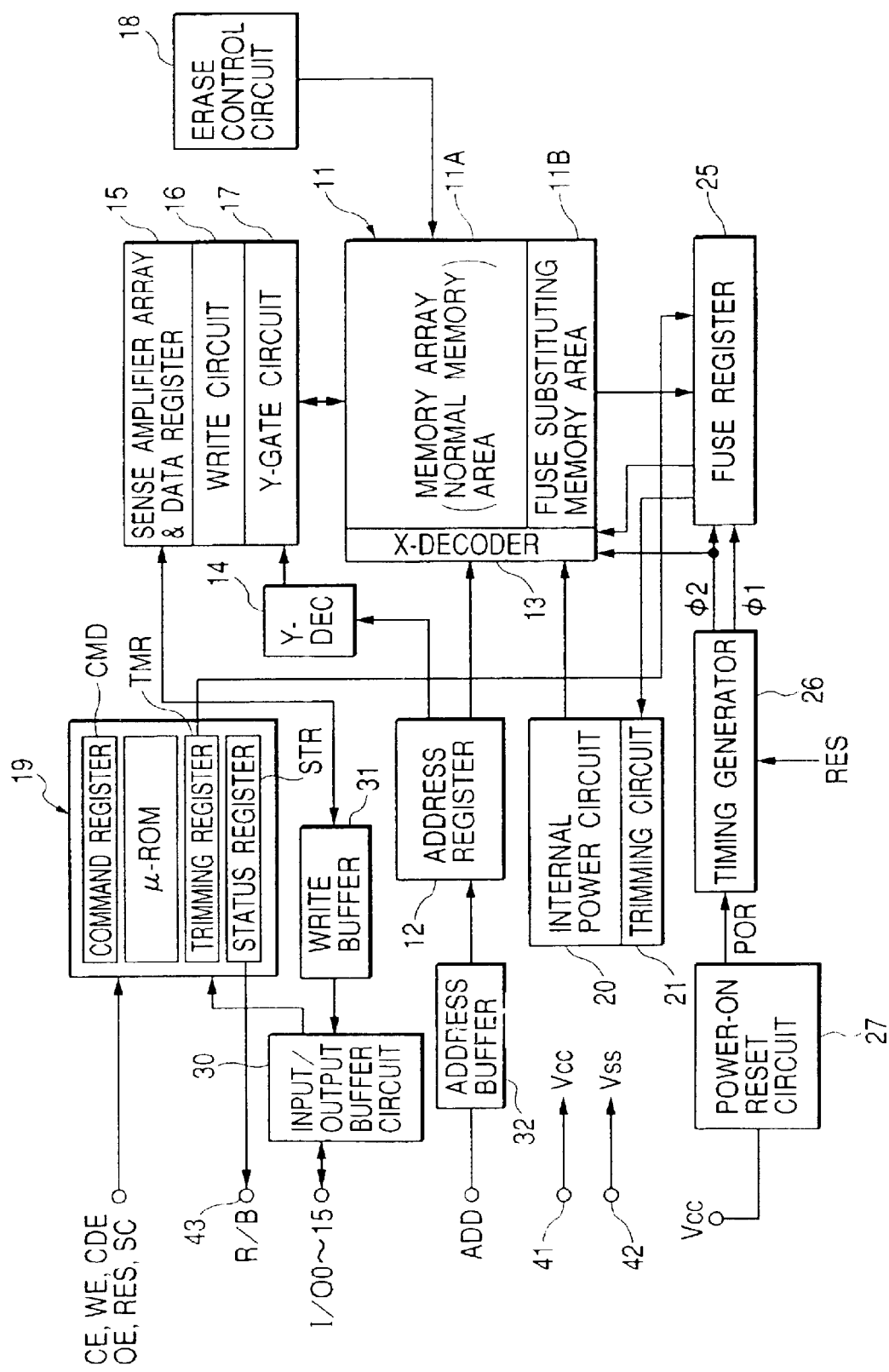
FIG. 1 is a block diagram showing an embodiment of a flash memory defined as one example of a nonvolatile semiconductor memory device effective for application for the present invention.

FIG. 1 is a block diagram showing an embodiment of a flash memory defined as one example of a nonvolatile memory device to which the present invention is applied. Although not restricted in particular, respective circuit blocks shown in FIG. 1 are formed on a single semiconductor chip like monocrystal silicon.

Figure 13A:
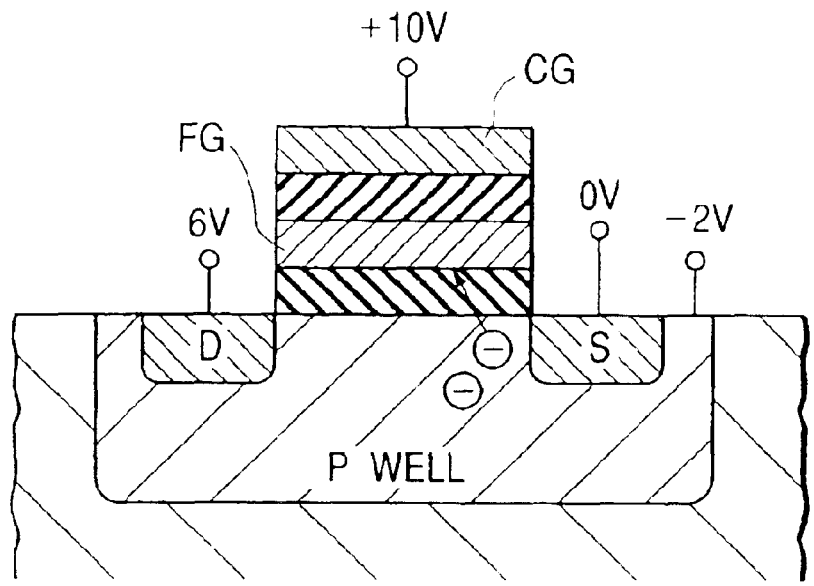
FIG. 13 is a sectional explanatory diagram showing one example illustrative of both a structure of a memory cell of a flash memory to which the present invention is applied, and bias voltages at writing and erasing.
Figure 13B:
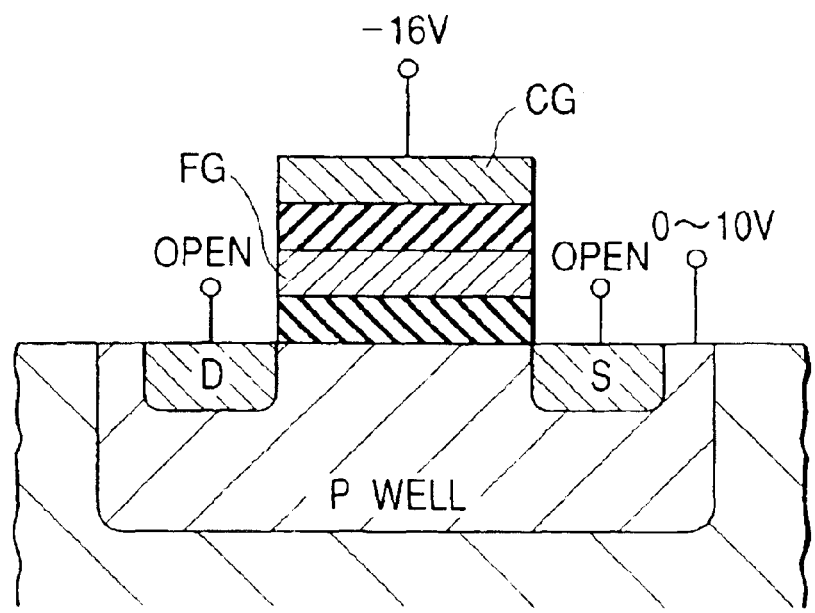

In FIG. 1, reference numeral 11 indicate a memory array in which memory cells used as nonvolatile storage or memory elements comprising MOSFETs each having a floating gate FG and a control gate CG isolated by such an insulating film as shown in FIG. 13 are arranged in matrix form, reference numeral 12 indicates an address register which holds or retains therein an address signal inputted from outside, reference numeral 13 indicates an X-decoder which selects one word line corresponding to an X address taken in the address register 12 from word lines lying within the memory array 11, reference numeral 14 indicates a Y-decoder which decodes a Y address taken in the address register 12, reference numeral 15 indicates a sense amplifier array & data register which amplifies the potential of each of bit lines of the memory cell array 11 and holds write data inputted from outside, reference numeral 16 indicates a write circuit which effects writing on the memory array 11, based on the write data held in the sense amplifier array & data register 15, and reference numeral 17 indicates a Y-gate circuit which connects a corresponding data line lying within the memory array 11 to the sense amplifier array & data register 15, based on a decode signal outputted from the Y-decoder 14, respectively.

Reference numeral 18 indicates an erase control circuit which performs the selection of blocks corresponding to erase units upon erasing, etc., reference numeral 19 indicates a control circuit (sequencer) which sequentially forms and outputs control signals for respective circuits provided inside the memory in order to execute processes corresponding to the corresponding commands, based on control signals and command (instruction) codes supplied from a control device such as an external microprocessor or the like, and reference numeral 20 indicates an internal power circuit which generates voltages necessary inside the chip, such as a write voltage, an erase voltage, a read voltage, a verify voltage, etc., based on a source voltage Vcc supplied from outside, respectively. Further, the flash memory according to the present embodiment is provided with a data input/output buffer circuit 30 which takes in a write data signal and command codes inputted from outside and outputs a data signal read from the memory array 11 and amplified by the sense amplifier to the outside.

The control circuit 19 is provided with a command register CMD which holds each command code inputted from outside. When the command code is supplied to the control circuit 19, the control circuit 19 decodes it and automatically executes a process corresponding to it. The control circuit 19 is provided with a ROM (Read Only Memory) μ-ROM which has stored therein a series of microinstruction groups necessary to execute commands, for example. The control circuit 19 successively executes microinstructions corresponding to the inputted command codes to thereby form control signals for the respective circuits provided inside the chip. Further, the control circuit 19 is provided with a status register STR which reflects its internal state.

The internal power circuit 20 is provided with a booster circuit like a charge pump, a reference power or power source generator which generates voltages used as the reference, such as a write voltage, an erase voltage, a read voltage, a verify voltage, etc., a power switching circuit which selects desired voltages from voltages generated according to the state of operation of the memory and supplies the same to the X-decoder 13, the write circuit 16, etc., and a power control circuit which controls these circuits, etc. Further, the internal power circuit 20 is provided with a trimming circuit 21 which adjusts each voltage generated by the internal power circuit 20.

The data input/output buffer circuit 30 are connected to input/output terminals I/O0 through I/O15 and are configured so as to time-divisionally input and output data and command in units of 16 bits or 8 bits, for example. There is also provided a write buffer memory 31 capable of holding write data written into each memory cell, which is inputted from outside and connected to one word line. Incidentally, in FIG. 1, reference numeral 32 indicates an address buffer which takes into or captures an address signal ADD inputted from outside, reference numeral 41 indicates a source voltage terminal to which a source voltage Vcc is applied from outside, and reference numeral 42 indicates a power voltage terminal (ground terminal) to which a ground voltage Vss is applied similarly.

As control signals inputted to the flash memory according to the present embodiment from the external CPU or the like, may be mentioned, for example, a reset signal RES, a chip selection signal CE, a write control signal WE, an output control signal OE, a command enable signal CDE used to indicate or designate a command input or a data input, a system clock SC, etc. Commands and addresses are respectively captured by or taken in the command register CMD and the address register 12 by the data input/output buffer circuit 30 and the address buffer 31 according to the command enable signal CDE and the write control signal WE. When the command enable signal CDE indicates the input of data, write data is taken in the data input/output buffer circuit 30 in synchronism with the system clock SC. Further, in the present embodiment, a ready/busy signal R/B indicative of whether accessing is made possible from outside, is outputted to an external terminal 43 according to a predetermined bit of a status register STR which reflects the internal state of the memory.

Further, the flash memory according to the present embodiment is provided with a fuse substituting memory area 11B defined as a set value storage area comprising the same nonvolatile storage or memory elements in addition to the normal memory area 11A lying within the memory array 11. Further, the flash memory is provided with a fuse register 25 which holds a set value read from the fuse substituting memory area 11B, a timing generator 26 which generates control timing signals for the fuse register 25, and a power-on reset circuit 27 which detects the leading edge of the source voltage to thereby generate a reset signal POR for starting the timing generator 26. As information stored in the fuse substituting memory area 11B, may be mentioned, information about the substitution with a spare memory cell in a redundant circuit, trimming information in the internal power circuit 20, product specification information indicative of product specifications about at which voltage used as the source voltage the corresponding memory is operated, etc.

Although not shown in FIG. 1, the memory array 11 is provided with spare or auxiliary memory arrays or columns each of which constitutes the redundant circuit. In regard to a row direction, a spare memory row for replacing a memory row including defective bits with another is provided. Further, the X-decoder 13 is provided with a redundant decoder for switching between memory rows according to the substitutional information stored in the fuse substituting memory area 11B. The data input/output buffer circuit 30 is provided with a circuit for switching a defective memory column lying within the memory array 11 to the corresponding spare memory column according to the substitutional information stored in the fuse substituting memory area 11B when an address for designating a memory column including a defective bit is inputted from outside. These substitutional information stored in the fuse substituting memory are 11B are temporarily taken or brought into the fuse register 25 and then supplied to the X-decoder and data input/output buffer circuit 30, followed by switching to the spare memory rows and columns.

The trimming information stored in the fuse substituting memory area 11B is taken in the fuse register 25 and used for the adjustment of the trimming circuit 21 which follows the internal power circuit 20 to thereby perform an adjustment in each generated voltage and an adjustment to the width of each write pulse. Further, the specification information stored in the fuse substituting memory area 11B is taken in the fuse register 25 and thereafter supplied to the control circuit 19, where timings for the control signals supplied to the respective circuits from the control circuit 19 are adjusted so that they become slow when, for example, the source voltage is low and when they become fast when the source voltage is high.

Figure 2:
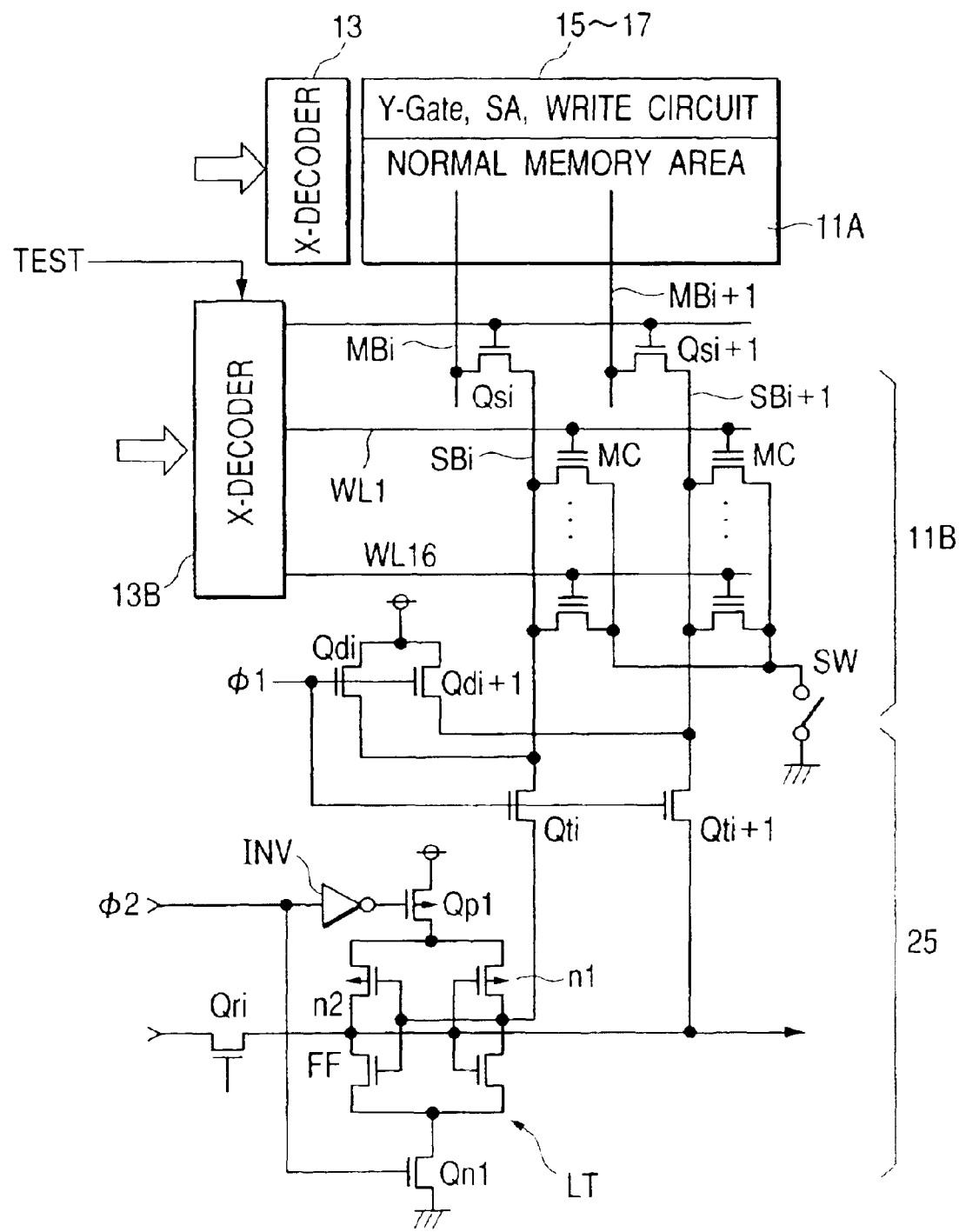
FIG. 2 is a circuit diagram showing examples of configurations of a fuse substituting memory area, a fuse register and peripheral circuits thereof of a memory array.

FIG. 2 schematically shows configurations of the fuse substituting memory area 11B and the fuse register 25 of the memory array 11, and its peripheral circuits. The fuse substituting memory area 11B of the memory array 11 has a configuration similar to the normal memory area 11. A plurality of memory cells MC are arranged in matrix form within the fuse substituting memory area 11B. Control gates of memory cells lying in the same row are respectively connected to common word lines WL1 through WL16. For simplicity of illustration, FIG. 2 specifically shows only a first group of memory cells (first memory cells) connected to word line WL1 and a second group of memory cells (second memory cells) connected to word line WL16. Although not restricted in particular, memory cells (hereinafter called "one sector") corresponding to (2048+64) as viewed in the row direction are disposed. Here, "64" of "2048+64" indicates the number of spare memory columns for the redundant circuit.

The memory cells MC lying in the same array of the fuse substituting memory area 11B have drains respectively connected to common sub bit lines SBi, SBi+1, . . . in units of 16 memory cells. The sub bit lines SBi, SBi+1, . . . are respectively connected to the normal memory area 11A and the common main bit lines MBi, MBi+1, . . . through selection switches MOSFETs Qsi, Qsi+1, . . . Here, signs i, i+1 affixed to the sub bit lines SB and the main bit lines MB are signs for identifying the bit lines in the respective columns. In the present embodiment, i assume or take values like 1 to (2048+64).

Incidentally, the selection switches MOSFETs Qsi, Qsi+1, . . . are respectively configured so as to be On-Off controlled by an X-decoder 13B activated by a control signal such as a test mode signal TEST or the like without being On-Off controlled by the X-decoder 13 for generating on and off control signals for similar selection switch MOSFETs Qs of the normal memory area 11A. Further, the selection switches MOSFETs Qsi, Qsi+1, . . . are respectively configured so that writing and erasing are carried out by the Y-gate circuit, the sense amplifier array, and the write circuit for the normal memory area 11A through the main bit lines MBi, MBi+1, . . . common to the normal memory area 11A upon a test mode or the like.

In a manner similar to the normal memory area 11A, the sources of the respective memory cells of the fuse substituting memory area 11B are respectively connected to a common source line SL for supplying a ground potential, in units (called "one memory block" in the present specification) like 16×(2048+64), which shares the use of the 16 memory cells and word lines WL1 through WL16 lying in the column direction. A switch SW is provided for the source line SL and serves so as to be capable of applying the ground potential to the source of each memory cell and bringing the source thereof into an open state. Any one of the respective word lines WL1 through WL16 is configured so as to be selectively brought to a selection level by the X-decoder 13B.

However, the X-decoder 13B is configured so as to operate as the original decoder according to the control signal TEST upon a test mode alone, to be inactivated upon a normal operation other than in the test mode to thereby fix the corresponding word line to a non-selected level, and to bring each of the word lines WL1 through WL16 in the fuse substituting memory area 11B to a selected level at power-up. These operations will be described in detail later.

Further, the other ends of the sub bit lines SBi, SBi+1, . . . in the fuse substituting memory area 11B are respectively connected to input/output nodes of latch circuits LT constituting the fuse register 25 through transmission MOSFETs Qti, Qti+1, . . . In the present embodiment, ones in which substitutional information or trimming information are actually stored, of the memory columns in the fuse substituting memory area 11B, are some (e.g., 512) of 2048. Thus, the transmission MOSFETs Qti, Qti+1, . . . and latch circuits LT are not provided for all the sub bit lines SBi, SBi+1, . . . , but are provided at intervals of two or four sub bit lines, for example. Further, the bit lines free of the provision of the transmission MOSFETs Qti, Qti+1, . . . and latch circuits L, and the memory cells connected thereto are respectively held in an unused state. They may not be formed in advance as an alternative to the fact that they are left as unused as they are.

In the present embodiment, the two sub bit lines SBi and SBi+1 adjacent to each other in the fuse substituting area 11B are formed as a pair. One sub bit line SBi thereof is connected to one (antiphase or negative-phase) input/output node n1 of the latch circuit LT, whereas the other sub bit line SBi+1 is provided so as to be connectable to the other (positive-phase) input/output node n2 of the latch circuit LT. Data stored in the memory cells of the fuse substituting memory area 11B are taken in or brought into the latch circuit LT in differential form.

Further, load MOSFETs Qdi, Qdi+1, . . . , each of which serves as a load on each memory cell, are connected to their corresponding sub bit lines SBi, SBi+1, . . . of the fuse substituting memory area 11B. Each of the word lines WL of the fuse substituting memory area 11B is brought to a selected level for the purpose of loading of data into the latch circuit. Further, the load MOSFETs Qdi, Qdi+1, . . . are turned on according to the conduction of the transmission MOSFETs Qti, Qti+1, . . . . These load MOSFETs Qdi, Qdi+1, . . . and the transmission MOSFETs Qti, Qti+1, . . . may be turned on according to the same timing signal $\phi 1$. However, Qd and Qt may not necessarily be turned on with the same timing.

The latch circuit LT comprises an flip-flop FF wherein input/output terminals of a pair of CMOS inverters are cross-connected, a power switch MOSFET Qp1 connected to the P-MOS side of the flip-flop, and a power switch MOSFET Qn1 connected to the N-MOS side. When the MOSFETs Qp1 and Qn1 are turned on according to the timing signal $\phi1$ and a signal obtained by inverting the timing signal $\phi$ by an inverter INV, they amplify the difference between potentials supplied to the input/output nodes n1 and n2. When the Qp1 and Qn1 are turned off according to the timing signal $\phi1$, they serve so as to assume or take a hold state for holding its immediately preceding state.

Incidentally, when any information is not written into the corresponding memory cell in the fuse substituting memory area 11B, the state of the memory cell becomes unstable. Thus, since the data transferred to the latch circuit is not specified, testing per se cannot be carried out. Therefore, in the present embodiment, a register TMR for setting trimming data is provided within the control circuit 19, and a switch MOSFET Qri used to allow the setting of predetermined data for testing is provided within the test circuit LT. In the test mode prior to the determination of trimming information, the data set to the trimming register TMR is transferred to the latch circuit LT and further supplied to the trimming circuit 21 to carry out testing. After the trimming information has been written into the fuse substituting memory area 11B, the data transferred from the fuse substituting memory area 11B to the latch circuit LT is used.

As an alternative to the provision of a selector switch for selectively transferring the data set to the trimming register TMR or the data set to the latch circuit LT to the trimming circuit 21 and the provision of the trimming register TMR, temporary trimming data for testing may directly be transferred to the latch circuit LT from outside before the commencement of testing. Alternatively, a resetting switch element may be provided for the latch circuit LT so that all of set data are respectively brought to a state of "0" according to an external reset signal.

Figure 3:
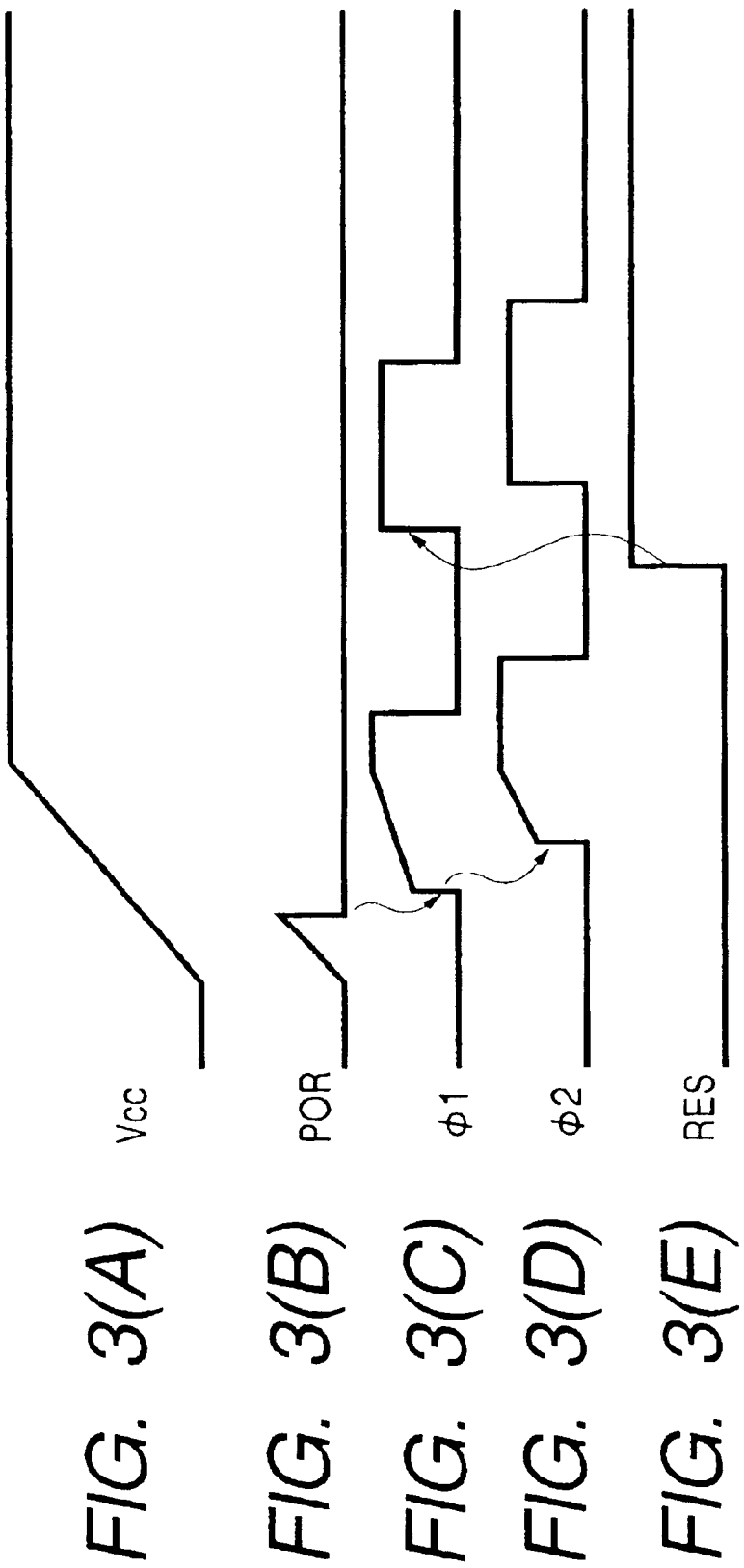
FIG. 3 is a timing chart illustrating latch timings provided for the fuse register employed in the flash memory according to the embodiment.

Operations of the fuse substituting memory area 11B and the latch circuit LT at power-up will next be described in brief by using a timing chart shown in FIG. 3. When the source voltage Vcc of the flash memory chip rises as illustrated in FIG. 3(A), the power-on reset circuit 27 detects it to generate such a power-on reset signal POR as shown in FIG. 3(B). In doing so, the timing generator 26 outputs such a timing signal $\phi1$ as shown in FIG. 3(C). Thus, the X-decoder 13B simultaneously change all of the word lines WL1 through WL16 of the fuse substituting memory area 11B to a selected level according to the timing signal $\phi1$. Further, the load MOSFETs Qdi, Qdi+1, . . . and the transmission MOSFETs Qti, Qti+1, . . . are respectively brought to an on state.

As a result, a current flows into the memory cells lying within the fuse substituting memory area 11B from the load MOSFETs Qdi, Qdi+1, . . . , so that the potential on each of the sub bit lines SBi, SBi+1, . . . changes according to the state (the level of each threshold voltage) of each memory cell at this time. The differences in potential between the paired sub bit lines SBi, SBi+1, . . . adjacent to one another are transferred to their corresponding latch circuits LT. The transmission MOSFETs Qti, Qti+1, . . . are made conductive so that the data can be transferred from the fuse substituting memory area 11B to the latch circuit LT.

On the other hand, such a timing signal $\phi2$ as shown in FIG. 3(D) is outputted from the timing generator 26 following the rise to the high level of the timing signal $\phi1$. When the signal $\phi2$ is rendered high in level, the latch circuit LT is brought to a non-activated state. Thus, the difference in potential between the adjacent sub bit lines SBi, SBi+1, . . . is transferred to the nodes n1 and n2, so that the latch circuit LT is activated according to the change of the timing signal $\phi2$ to a low level. Therefore, the potential difference at the nodes is amplified and held by the latch circuit LT.

Further, in the present embodiment, even when the reset signal RES is inputted from outside, the timing generator 26 generates the timing signals $\phi1$ and $\phi2$ to reload the fuse set data stored in the memory cells lying within the fuse substituting memory area 11B into their corresponding latch circuits LT. Loading the fuse set data into the fuse register 25 according to the power-on reset signal POR and the externally-inputted reset signal RES respectively in this way allows an improvement in reliability of the data held in the fuse register 25.

In the flash memory according to the present embodiment, although not restricted in particular, 0V is applied to the source of a memory cell desired to increase its threshold voltage and 6V, for example, is applied to the drain thereof in a state in which a positive high voltage (e.g., +10V) has been applied to a control gate CG (word line WL) upon writing as shown in FIG. 13(A) to thereby allow a drain current to flow through a channel, whereby hot electrons generated herein are injected into a floating gate FG to increase its threshold voltage. Therefore, a sub bit line SB to which each memory cell (e.g., data "1") desired to increase its threshold voltage is connected, is brought to a potential like 6V according to written data. While the potential of a well region WELL is −2V at this time in the present embodiment, another potential may be used in the present embodiment (e.g., 0V may be used). On the other hand, 0V is applied to a sub bit line SB to which each memory cell (e.g., data "0") undesired to increase its threshold voltage is connected. Upon writing, the source of each selected memory cell is brought to 0V. Incidentally, the write operation is carried out in byte units of 8 bits or word units of 16 bits, for example. However, data may be written while being shifted one bit by one bit.

On the other hand, upon erasure of data, a negative high voltage (e.g., −16V) is applied to a control gate CG (word line WL) and a positive voltage which ranges from 0V to 10V, is applied to a well region as shown in FIG. 3(B) to extract a negative charge from a floating gate FG of each memory cell according to an FN tunnel phenomenon, thereby decreasing its threshold voltage. Incidentally, upon erasing, the drain (sub bit line SB) and source (common source line SL) thereof are rendered open, i.e., potentially floating.

A procedure for specifically writing data (fuse set value) into the fuse substituting memory area 11B will next be described with reference to a flowchart shown in FIG. 4. The flowchart shows a control procedure executed by a flash memory control circuit 19.

Although not restricted in particular, the flash memory according to the present embodiment is configured so as to be capable of writing data into the fuse substituting memory area 11B and reading the same therefrom according to the input of a predetermined command (fuse substituting memory area access command) unopened to a user in the test mode. Thus, the setting of data into the fuse substituting memory region 11B according to the flowchart is carried out through the use of a tester upon probe inspection, for example. Incidentally, a write command, a read command and an erase command common upon the normal operation are effective even if the mode is shifted to the test mode. The writing and reading are started according to the input of the command.

Figure 4:
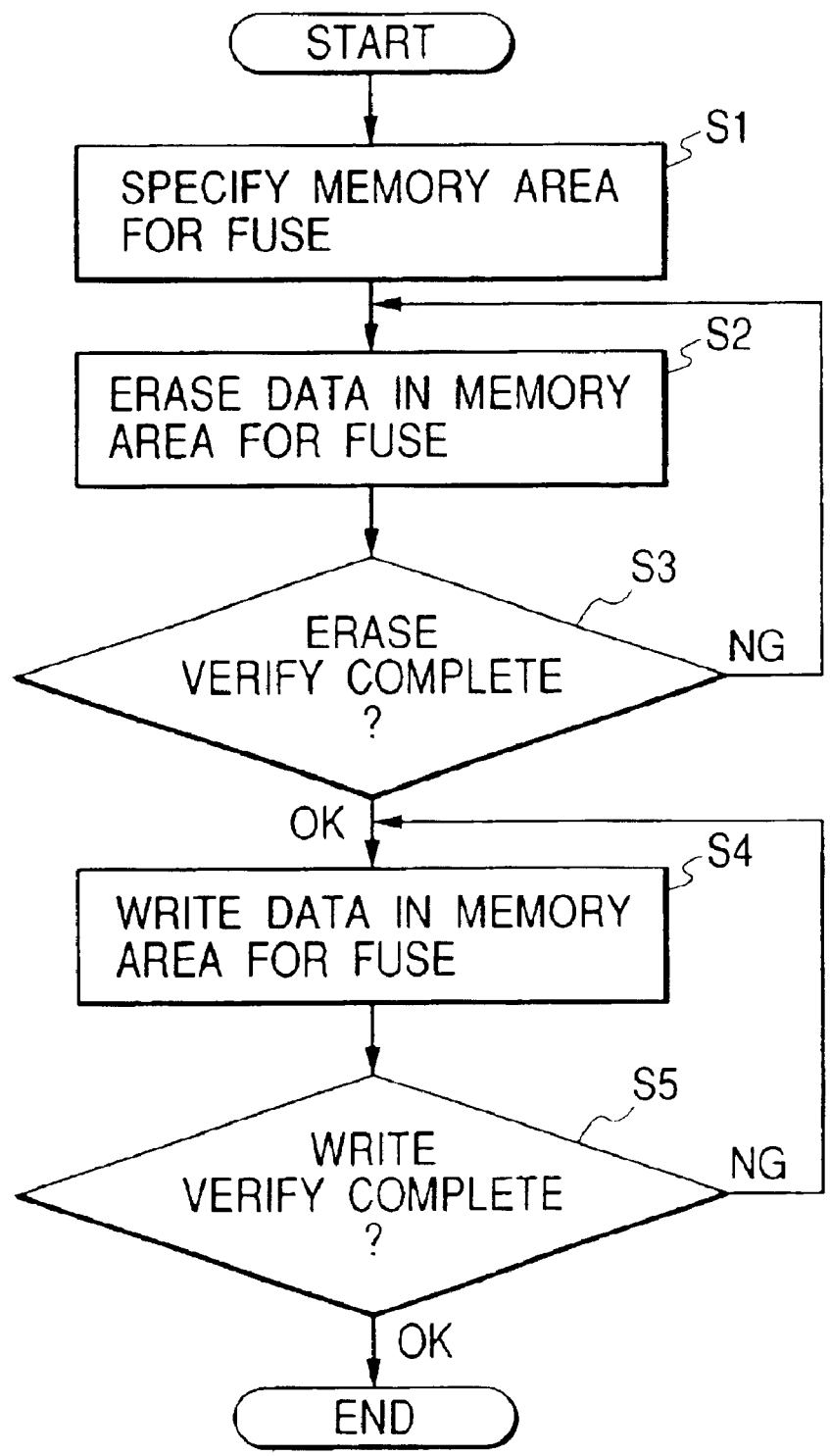
FIG. 4 is a flowchart showing a specific procedure for writing data into the fuse substituting memory area employed in the flash-memory according to the embodiment.

A flowchart shown in FIG. 4 is started according to the input of a test command and a fuse substituting memory area access command to the flash memory from an external tester or the like. When the control circuit 19 decodes a command inputted in a test mode and recognizes it as a fuse substituting memory area access command, the control circuit 19 brings the X-decoder 13A of the normal memory area 11A into a non-activated state and activates the X-decoder 13B of the fuse substituting memory area 11B to thereby select the fuse substituting memory area 11B (Step S1).

Next, the control circuit 19 applies a negative voltage (e.g., −16V) to all the word lines WL1 through WL16 of the fuse substituting memory area 11B by means of the X-decoder 13B. The control circuit 19 renders the sub bit line SB and the command source line SL open (floating) through the use of the erase circuit 18 and temporarily brings all the memory cells in the fuse substituting memory area 11B into an erased state (corresponding to a state in which the lowest threshold voltage corresponding to data "0" is low) (Step S3).

After a while, the word lines WL1 through WL16 are set to a selected level (corresponding to a potential slightly lower than an intermediate voltage between a high threshold voltage and a low threshold voltage of each memory cell) for verify reading in turn to activate the sense amplifier array & data register 15 for reading data therefrom, whereby the control circuit 19 determines through the use of the external tester whether threshold voltages Vth of all the memory cells lying within the fuse substituting memory area 11B are lower than or equal to an erase verify voltage VWE1 (Step S3). When it is determined that the memory cell whose threshold voltage is higher than VWE1, exists even one, the control circuit 19 returns to Step S2, where the erase operation is carried out again. Incidentally, the verify reading is continuously carried out continuously upon writing without any command in the present embodiment, the verify reading may be carried out by inputting a verify command from outside.

On the other hand, when it is determined in Step S3 that the threshold voltages Vth of all the memory cells are lower than or equal to VWE1, the control circuit 19 proceeds to Step S4 where the writing of data into the fuse substituting memory area 11B is carried out. Incidentally, a so-called write-back operation may be carried out wherein the threshold voltage of each memory cell whose threshold voltage are excessively lowered due to the erase operation, is slightly increased before such writing. The write command is set to the command register CMD and the write data, i.e., fuse set value is set to the sense amplifier array & data register 15 to thereby perform the writing in Step S4.

Thus, the control circuit 19 applies a high voltage (e.g., 16V) to the word lines WL1 through WL16 of the fuse substituting memory area 11B through the X-decoder 13B in turn and turns on the switch SW to apply 0V to the common source line SL, thereby applying, for example, 6V to a sub bit line SB to which each memory cell desired to increase a threshold voltage corresponding to data "1" set to the sense amplifier array & data register 15 is connected and applying a write-prohibition voltage (0V) to a sub bit line SB to which each memory cell undesired to increase a threshold voltage corresponding to data "0" is connected. Namely, the same data, are sequentially written into 16 memory cells in the same column in the present embodiment.

In the present embodiment, complementary data are respectively written into memory cells lying in an even-numbered sequence or column assuming that data written into memory cells lying in an odd-numbered column or sequence are defined as the original set data. Incidentally, when the current supply capacity of the internal power circuit 20 is sufficient or when the storage capacity of the fuse substituting memory region 11B is small, the plurality of word lines are respectively set to the selected level and the writing can also simultaneously be effected on the plurality of memory columns.

Next, the word lines WL1 through WL16 are set to a selected level (corresponding to an intermediate potential between a high threshold voltage and a low threshold voltage of each memory cell) for verify reading in turn to activate the sense amplifier array & data register 15 for reading data therefrom, whereby it is determined whether threshold voltages Vth of memory cells corresponding to write data "1" are higher than or equal to a write verify voltage VWV (Step S5). When it is determined that each memory cell whose threshold voltage is lower than VWV, exists in memory cells intended for writing, the control circuit 19 returns to Step S4, where the writing is carried out again. Incidentally, the data written at this time are write data (corresponding to data set to "1" in the case of unwritten bits alone) reproduced by the external tester or the like, based on the data read according to the verify operation referred to above. When it is determined in Step S5 that the threshold voltages vth of all the memory cells corresponding to the write data "1" are higher than the verify voltage VWV, a fuse setting process is finished.

In the flash memory according to the present embodiment as described above, the same data is written into the sixteen memory cells lying in the same column. Upon power-up, the word lines WL1 through WL16 of the fuse substituting memory area 11B are respectively brought to the selected level so that the data stored in all the memory cells are transferred to and stored in their corresponding latch circuits LT of the fuse register 25. Therefore, the data settled by majority decision of the data stored in the sixteen memory cells are stored therein. Further, the complementary data are stored in the odd-numbered and even-numbered columns, and each of the latch circuits LT of the fuse register 25 differentially amplifies the data and latches the same therein.

Since no source voltage is determined and the level of data read from the corresponding memory cell is not sufficient upon power-up, the data are settled by majority decision and differentially detected as described above, whereby the set values high in reliability are held in the fuse register 25. When the reset signal RES is inputted from outside after the power is completely on, the loading of each set value into the fuse register 25 from the memory array 11 is carried out again. Therefore, the subsequent held data results in one higher in reliability. However, the flash memory according to the present embodiment is capable of loading the set values relatively high in reliability into the fuse register 25 when the reset signal RES is not inputted or even before the input thereof.

Figure 5:
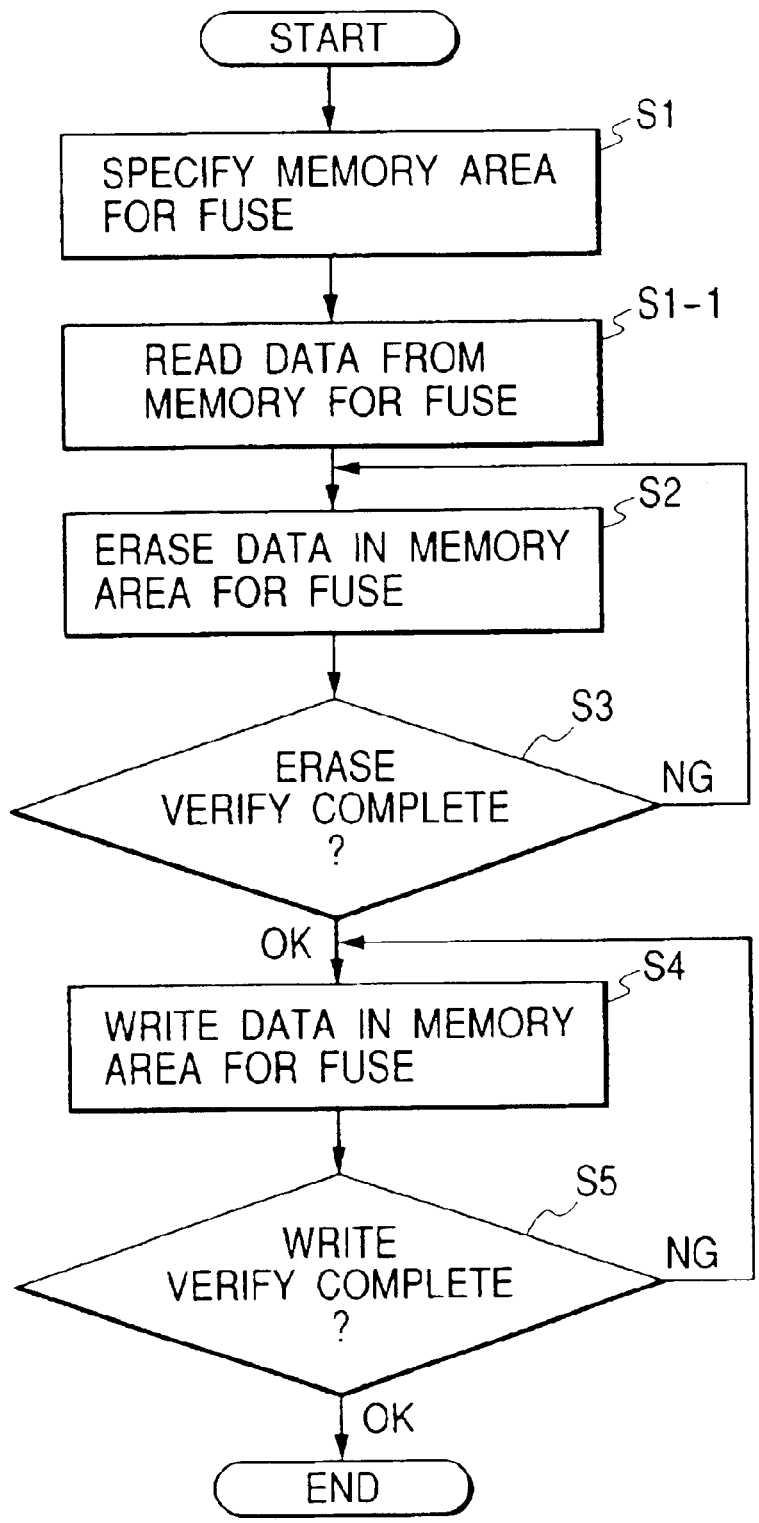
FIG. 5 is a flowchart illustrating a specific procedure for writing data into the fuse substituting memory area subsequent to package assembly, which is used in the flash memory according to the embodiment.

Further, the flash memory according to the present embodiment is capable of setting the data to the fuse substituting memory area 11B and changing each set value even after each chip has built into the package. FIG. 5 shows a procedure for specifically writing data (fuse set value) into the fuse substituting memory area 11B subsequent to the package assembly. This procedure is substantially similar to the procedure at the probe inspection shown in FIG. 4. The procedure shown in FIG. 5 is different from the procedure shown in FIG. 4 only in that the reading (Step S1-1) of the data from the fuse substituting memory region 11B is carried out before the erasure in Step S2 shown in FIG. 4. The external tester is capable of merging the read data and new set data into re-set data.

The flash memory is configured so as to erase the data in memory block units. Therefore, when a new defective bit is detected after the package assembly and hence there is need to rewrite the data in the fuse substituting memory area 11B, the already-written set value is read and ORed with a new set value to thereby merge them into reset data. This processing is rational. In the flash memory according to the embodiment, when the fuse substituting memory area 11B is rewritten or updated, the set data stored already before the erasure of the data is read and the read set data and the new set data can easily be merged into reset data. Thus, an advantage is brought about in that there is no need to store the data written into the fuse substituting memory area 11B for each chip in a wafer stage, and there is no possibility that the data will be combined or merged with data in another chip and the combined data will be written therein.

Figure 6:
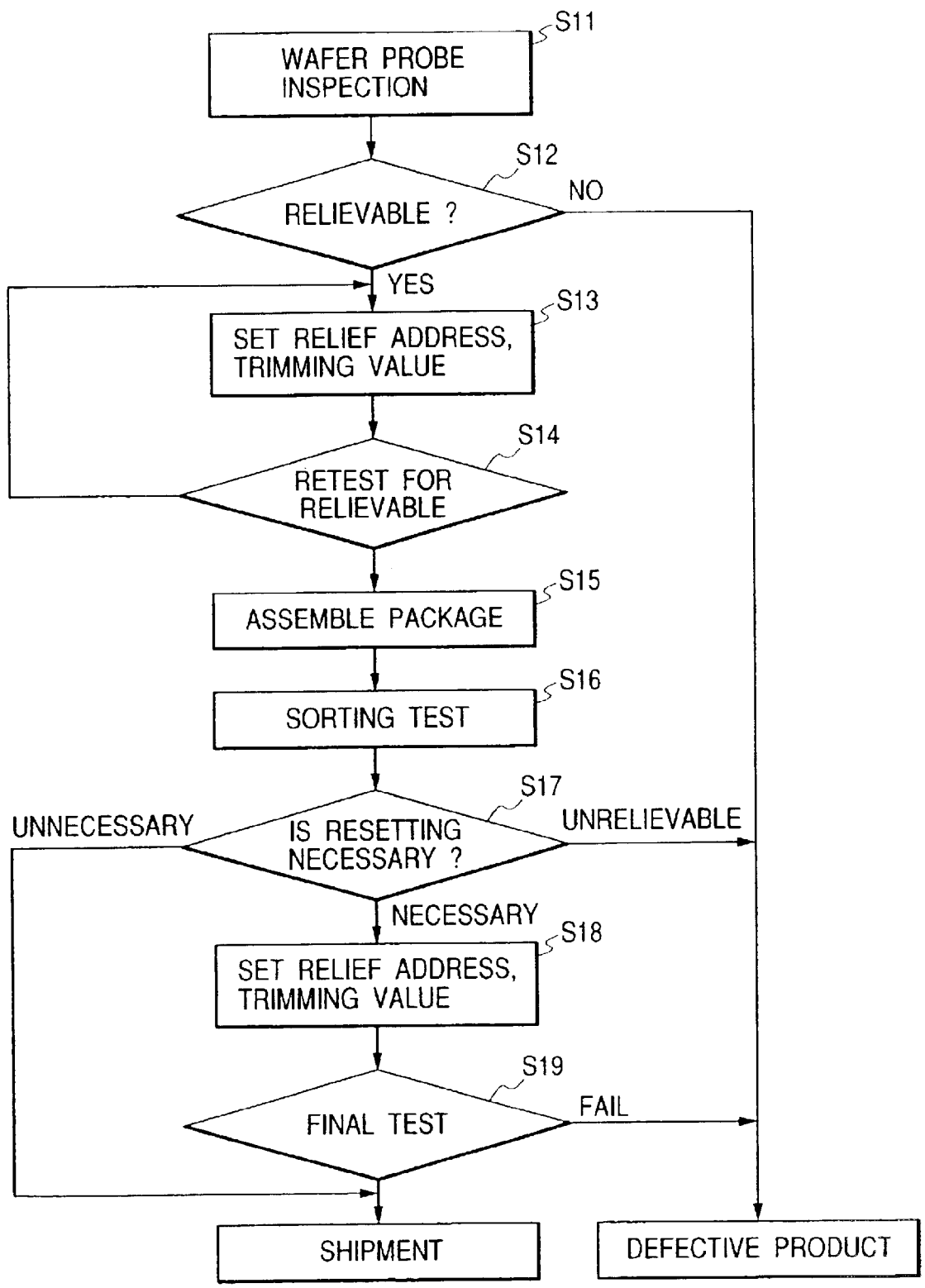
FIG. 6 is a flowchart showing a procedure from a test to shipment subsequent to a wafer process of the flash memory according to the embodiment.

FIG. 6 shows a procedure of a test to shipment subsequent to a wafer process of the flash memory to which the present invention is applied.

Upon completion of the wafer process, the flash memory to which the present invention is applied, first performs a probe inspection in a wafer state (Step S11). It is determined based on the result of inspection whether a relief is allowed or made possible. If it is judged that the relief can be carried out, then the setting of substitutional information to the fuse substituting memory area and the setting of trimming information can be carried out (Steps S12 and S13). Then, a probe inspection (Step S14) as to whether each set value is proper, is performed. When it is found not to be proper, the routine procedure returns to Step S13, where the setting of information to the fuse substituting memory area is carried out again. If it is found to be proper, then the routine procedure proceeds to Step S15.

In Step S15, respective chips are cut out from a wafer to build into packages. After a while, a sorting test using a tester is executed (Step S16). It is determined based on the result of the test whether a new relief is necessary and a change in trimming information is required. If they are found to be necessary, then the setting of substitutional information to the fuse substitutional memory area and the setting of trimming information are carried out (Steps S17 and S18). Then a retest (Step S19) as to whether set values are proper, is executed. When the set values are found not to be proper, the routine procedure returns to Step S18, where the setting to the fuse substitutional memory area is carried out again. When the set values are found to be proper, each product is shipmented as a non-defective product.

As described above, the flash memory to which the present invention is applied, brings about an advantage in that since the relief subsequent to the package assembly and the resetting (Step S18) of the trimming information, which have heretofore been unfeasible, are made possible, the yield and reliability of each product are enhanced, and the optimization of a boosted voltage and a write time can accurately be carried out, whereby a write time required is shortened.

Figure 7:
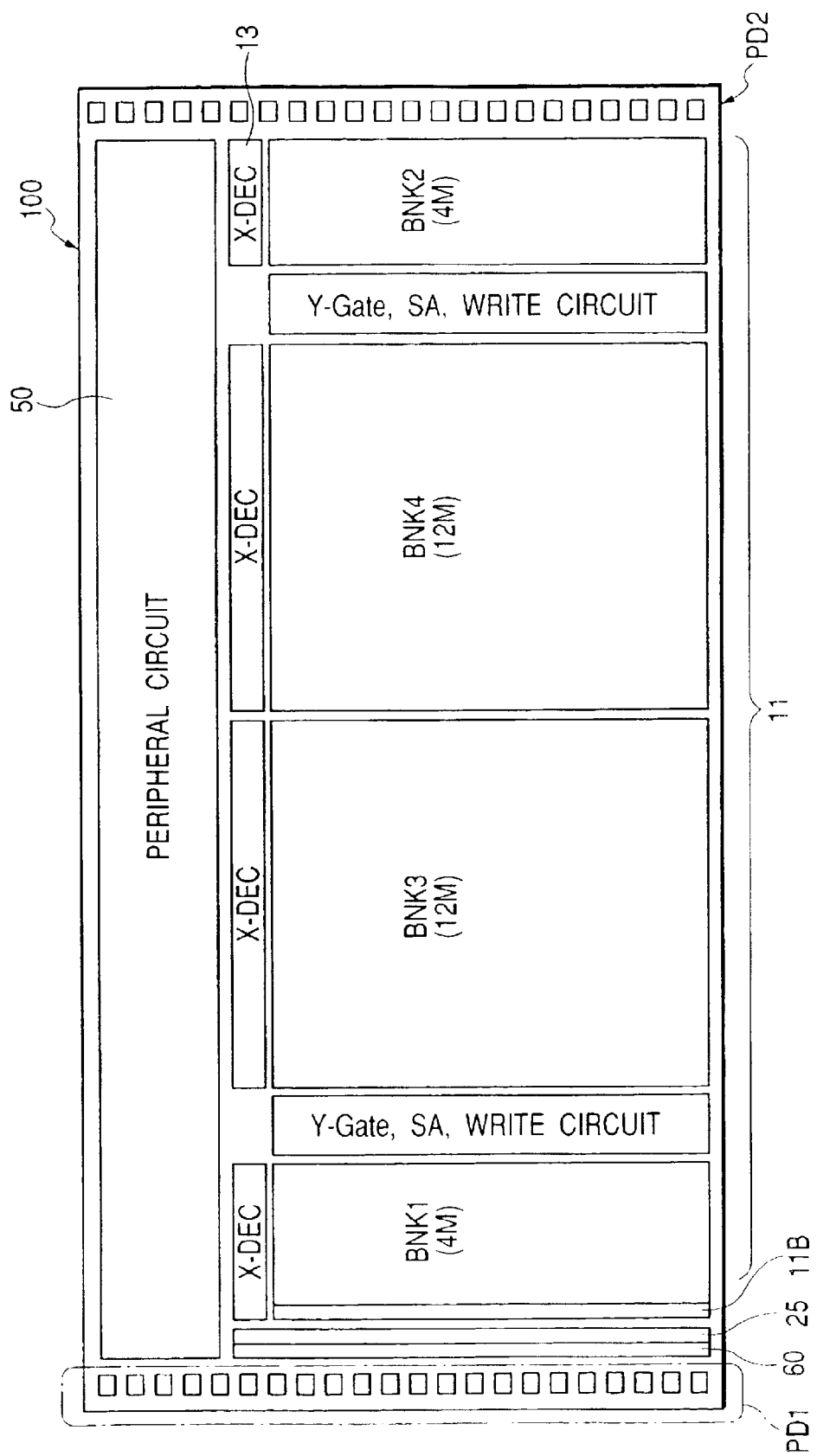
FIG. 7 is a plan explanatory diagram illustrating one example of a chip layout of a flash memory to which the present invention is applied.

FIG. 7 shows one example of a chip layout of a flash memory to which the present invention is applied. In the drawing, reference numeral 100 indicates a semiconductor chip like monocrystal silicon, and reference numeral 11 indicates a memory array formed on the chip 100. In the present embodiment, the memory array 11 is made up of four banks BNK1 through BNK4. Y-gate circuits 17, sense amplifier arrays 15, and write circuits 16 are respectively disposed between the banks BNK1 and BNK3 and between the banks BNK2 and BNK4. Further, X-decoders 13 are disposed along one side of the memory array 11, and a peripheral circuit 50 such as the control circuit 19, internal power circuit 20, address register 12, Y-decoder 14, erase circuit 18, timing generator 26, or the like. shown in FIG. 1 is disposed thereoutside.

Further, pad arrays PD1 and PD2 are provided along both sides of the chip 100. PD1 of these are principally data input/output pads, and PD2 are principally address input pads. Incidentally, although not illustrated in the drawing, input/output buffers are provided in the neighborhood of the respective pads. Further, in the present embodiment, the fuse substituting memory area 11B and fuse register 25 are provided on the side near the pad array PD1, of the bank BNK1. Further, a circuit 60 for distributing write data captured by the input buffer according to the data read from the fuse register 25 to the fuse substituting memory area 11B to the sense amplifier array & data register 15 and distributing read data amplified by the sense amplifier array to the data input/output pads is provided between the fuse register 25 and the pad array PD1.

Figure 8:
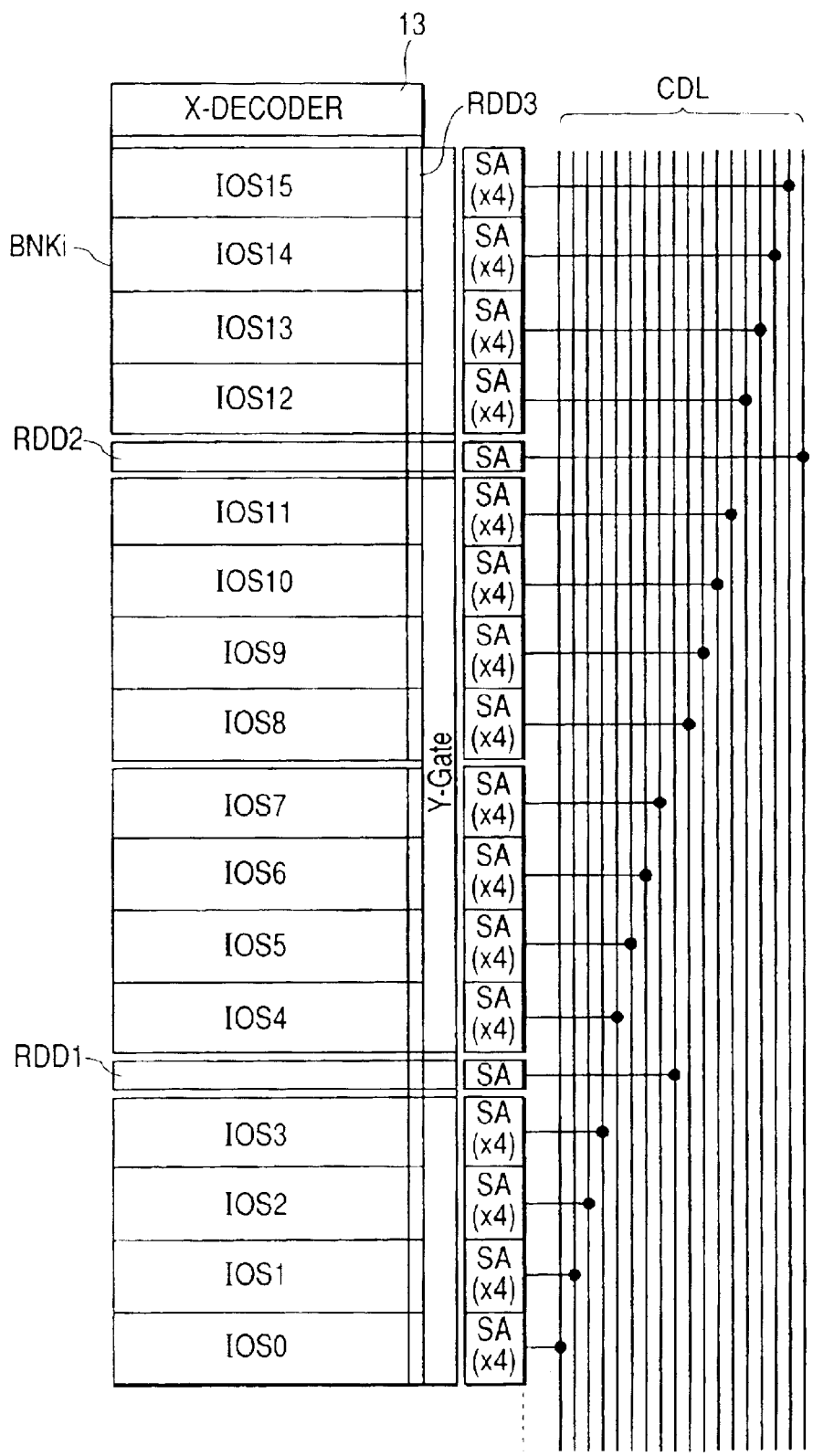
FIG. 8 is a circuit configuration diagram showing configuration examples of banks which constitute a memory array employed in the flash memory according to the embodiment.

As shown in FIG. 8 by way of example, the respective banks are divided into 16 I/O sets IOS0 through IOS15 by 128 columns along a row direction. Each of data corresponding to 16 bits in total is read into and written in a common data line CDL bit by bit from each of the I/O sets according to one column address. A column address for specifying one from 128 columns will hereinafter be called "a unit address". Redundancy relieving circuits RDD1 and RDD2, which respectively comprise 32 spare or auxiliary memory columns, are provided at two points in parts with respect to the 16 I/O sets IOS0 through IOS15. Incidentally, designated at sign RDD3 in FIG. 8 is a redundancy relieving circuit which comprises spare memory rows extending in a word line direction.

Figure 9:
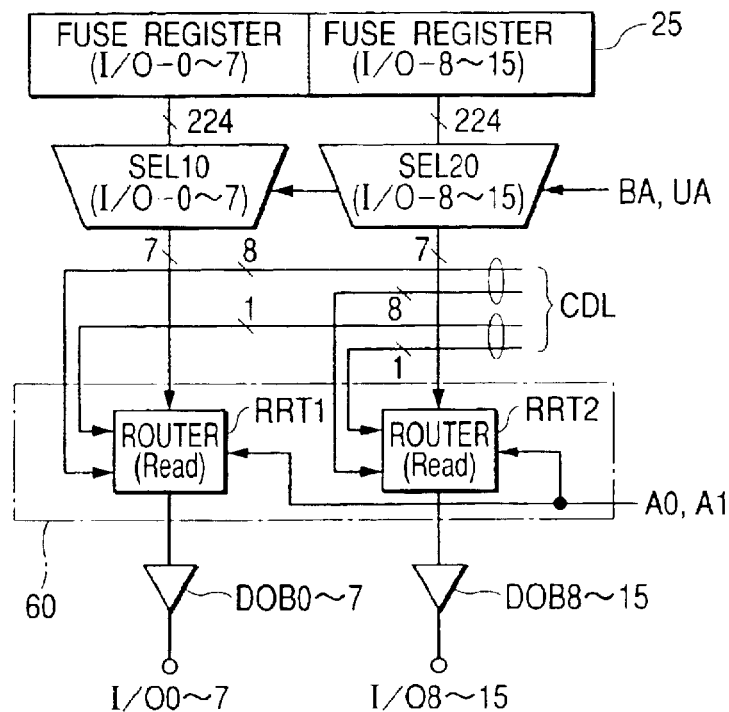
FIG. 9 is a block diagram depicting examples of configurations of fuse registers and a distribution circuit on the reading side.

FIG. 9 shows examples of configurations of fuse registers 25 and a distribution circuit 60. In the same drawing, DOB0 through 7 and DOB8 through 15 respectively indicate data output buffers respectively connected to data input/output terminals I/O0 through 7 and I/O8 through 15, and SEL10 and SEL20 indicate selectors which respectively select data corresponding to a bank address BA and a unit address UA from data set to the fuse registers 25 and supply the same to read routers RRT1 and RRT2.

Thus, if substitutional information corresponding to addresses for a memory array when the memory array is accessed, are held in the fuse registers 25, then the substitutional information are automatically supplied to the read routers RRT1 and RRT2 by the selectors SEL10 and SEL20. In the present embodiment, information corresponding to "nil" is stored in the fuse substituting memory area 11B when no defective bits exit. Upon power-up, the information is read into its corresponding fuse register 25.

The information supplied from the fuse register 25 to the selectors SEL10 and SEL20 are given as 7 bits. The three bits of these correspond to information indicative of the positions of defective bits of 8-bit data, the two bits correspond to information for specifying or designating sense amplifiers to be used, of four sense amplifiers respectively provided in association with the respective I/O sets of the memory array, and the remaining two bits correspond to information (enable bit) indicative of whether substitutional information for redundancy relief have been set. The reason why the enable bit is given as two bits, is to ensure accuracy. One bit may be taken or used in principle. The information for specifying the sense amplifiers are not necessary depending on the configurations of the peripheral circuits.

As shown in FIG. 9, the number of signal lines from the data input/output terminals I/O0 through 7 and I/O8 through 15 to the read routers RRT1 and RRT2 is 16, whereas the number of signal lines from the read routers RRT1 and RRT2 to the memory array 11 is 18. Of these, the 16 signal lines are common data lines corresponding to normal memory columns, and the remaining two lines are redundant common data lines corresponding to spare memory columns.

The read routers RRT1 and RRT2 respectively perform switching between normal and redundant common data lines according to the set data held in the fuse registers 25 to thereby output proper read data. The read routers RRT1 and RRT2 respectively compare lower bits A0 and A1 of addresses and 2-bit information supplied from the fuse registers 25 through the selectors SEL10 and SEL20 and for specifying the corresponding sense amplifiers to be used, of the four sense amplifiers provided in association with the I/O sets of the memory array. When they coincide with each other, the read routers RRT1 and RRT2 respectively perform switching between the normal and redundant common data lines. When the enable bit in the 7 bits supplied from the fuse registers 25 is set to an effective level, such switching is performed based on the 3-bit information indicative of the positions of the defective bits, and data in which the switching has been performed, are respectively outputted to the input/output terminals I/O0 through 15.

Figure 10:
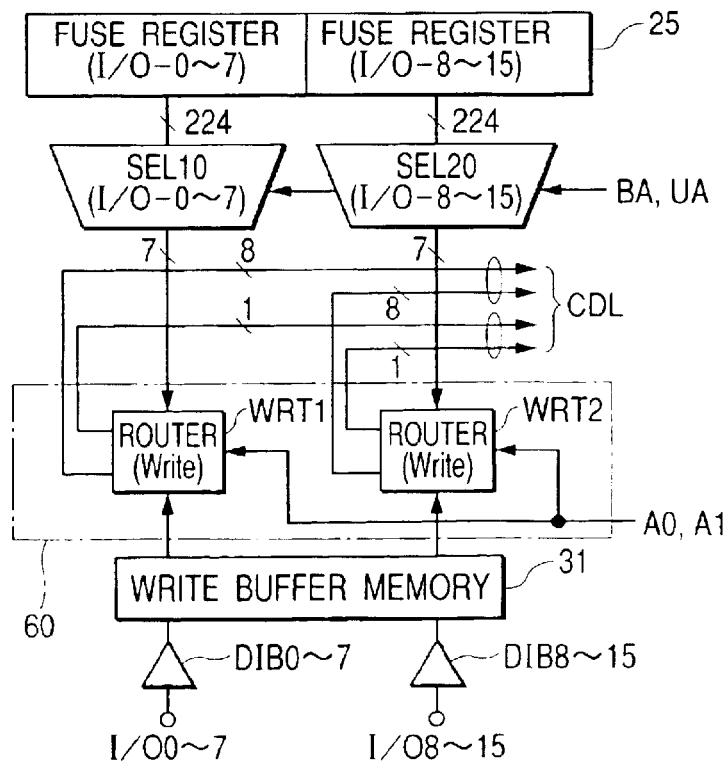
FIG. 10 is a block diagram showing examples of configurations of fuse registers and a distribution circuit on the writing side.

FIG. 10 shows examples of configurations of a distribution circuit 60 including write routers WRT1 and WRT2 which respectively switch between the normal and redundant common data lines according to the data set to the fuse registers 25 to thereby transmit write data inputted to data input/output terminals I/O0 through 7 and I/O8 through 15, or skip signal lines corresponding to defective memory arrays or columns to shift the data to adjacent signal lines, and peripheral circuits thereof.

The circuit on the write side shown in FIG. 10 is substantially similar to the circuit on the read side of FIG. 9. The circuit on the write side is different from that on the read side in that the direction of data is placed in reverse and a write buffer memory 31 is provided between data input buffers DIF0 through 7 and DIF8 through 15 and the write routers WRT1 and WRT2. The write buffer 31 is configured so as to have 2048-bit storage capacities in association with the number of normal memory cells 2048 corresponding to one sector. Upon writing, data corresponding to one sector are taken in the write buffer memory 31 from outside in units like 16 bits. The write buffer memory 31 transfers data of 2048+64 bits including redundant bits to the sense amplifier array & data register 15 through the write routers WRT1 and WRT2.

In the flash memory according to the present embodiment as described above, the fuse registers 25 are disposed on the side near the data input/output terminals I/O0 through 7 and I/O8 through 15, and the distribution circuit 60 is provided between each fuse register 25 and the pad array PD1. Therefore, wiring routing can simply be carried out and the length of each wiring can also be shortened. Since the distribution circuit 60 is disposed in the neighborhood of the fuse registers 25, there is an advantage that the transfer and distribution of each signal can smoothly be carried out. Namely, there is also the way of considering that the distribution circuit 60 is placed in the neighborhood of its corresponding sense amplifier array. However, when the sense amplifier arrays are provided at two or more points in distributed form as in the present embodiment, the distribution circuits are also distributed and hence wiring routing become complex. However, the distribution circuit can collectively be provided at one point owing to the provision thereof on the side near the data input/output terminals I/O0 through 7 and I/O8 through 15 and hence the wiring routing can easily be carried out.

Incidentally, the write buffer memory 31 shown in FIG. 10 may be placed between the data input/output terminals I/O0 through 7 and I/O8 through 15 and the write routers WRT1 and WRT2. However, the write buffer memory 31 may be disposed on the pad array PD1 side of the peripheral circuit 50 shown in FIG. 7, i.e., at the upper left corner of the chip 100.

Figure 11:
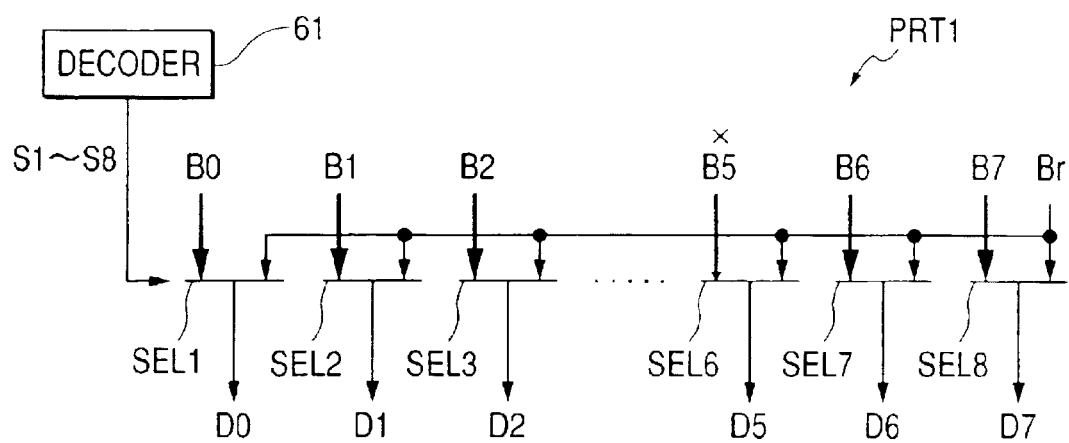
FIG. 11 is a circuit configuration diagram showing a schematic configuration of a read router which constitutes the distribution circuit on the reading side.

FIG. 11 shows a schematic configuration of the read router RRT1. In the drawing, SEL1 through SEL8 indicate selectors which allow one bit of 2-bit input signals to pass therethrough, and reference numeral 61 indicates a decoder which decodes set data supplied from the fuse register 25 through the selector SEL10 to thereby generate switch control signals S1 through S8 for the selectors SEL1 through SEL8. Any Bi (where i=0, 1, 2, ... 7) of respective bits B0 through B7 corresponding to one-byte data read from the memory array and supplied via common data lines CDL, and a redundant bit Br sent from a spare memory column of the redundancy relieving circuit RDD1 or RDD2 are commonly inputted to input terminals of the SEL1 through SEL7 of the selectors SEL1 through SEL8. The selectors corresponding to defective bits are selected from the selectors SEL1 through SEL8 according to the control signals S1 through S8 outputted from the decoder 61, and the corresponding redundant bits Br are selected in place of the defective bits as signals D0 through D7 corresponding to 8 bits in total.

In FIG. 11, the signals selected by the selectors SEL1 through SEL8 are indicated by thick lines when the bit B5 is defective as one example. Namely, FIG. 11 shows the manner in which the SEL1 through SEL5, and the SEL7 and SEL8 of the selectors SEL1 through SEL8 respectively select the bits B0 through B4 and B6 and B7 of the normal memory column, and the selector SEL6 selects the redundant bit Br.

In a manner similar to the read router RRT2, 9-bit read data B8 through B15, and Br including redundant bits are supplied thereto and the 8 bits thereof are selected and outputted according to the set data supplied from the fuse register 25. When no defective ones are included in the normal 8 bits, no substitutional information is set to the corresponding fuse register 25, and the decoder 61 generates such switch control signals S1 through S8 as to select the normal 8 bits and supplies them to the selectors SEL1 through SEL8.

Figure 12:
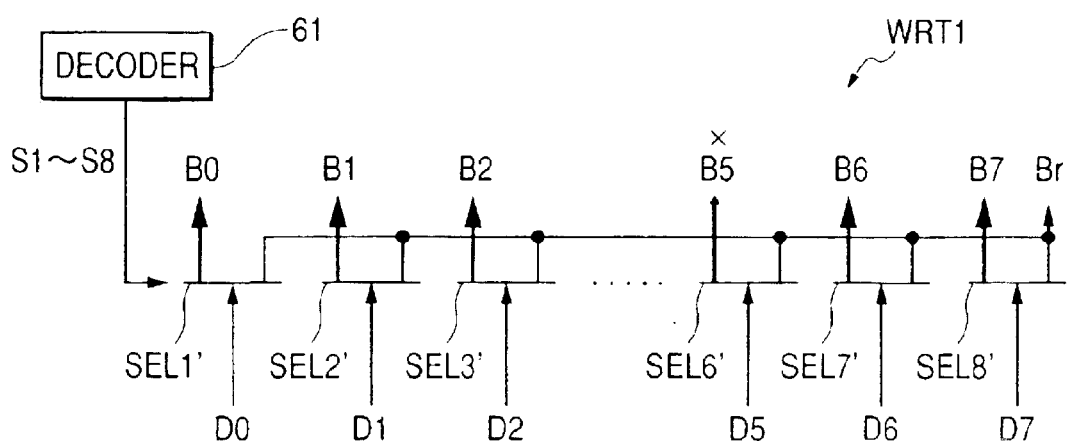
FIG. 12 is a circuit configuration diagram illustrating a schematic configuration of a write router which constitutes the distribution circuit on the writing side.

As shown in FIG. 12, the write routers WRT1 and WRT2 are configured so that the direction of data transmission becomes opposite to that for the read routers RRT1 and RRT2.

While the invention made above by the present inventors has been described specifically based on the illustrated embodiments, the present invention is not limited to the embodiments. It is needless to say that various changes can be made thereto within the scope not departing from the substance thereof. The present embodiment has described the flash memory of such a type that the threshold voltage of each memory cell is reduced by erasing, and the threshold voltage of each memory cell is increased by writing. However, the present invention can be applied even to a flash memory wherein the threshold voltage of each memory cell is raised by erasing and the threshold voltage of each memory cell is lowered by writing.

In the present embodiment, the writing of the data into each storage or memory element having the floating gate is carried out by using the hot electrons generated according to the flow of the drain current, whereas the erasing is done by use of the FN tunnel phenomenon. However, the invention can be applied even to a flash memory configured so as to perform writing and erasing by use of the FN tunnel phenomenon respectively. Further, while the present embodiment has described the case in which each of the spare memory columns is configured so that each defective bit is replaced by another according to the substitutional information by means of the router. However, in a manner similar to the spare memory rows even as to the spare memory columns, the Y-decoder may be configured so that the relief address is selected according to the switching to the address for the spare memory column.

While the above description has principally been made of the case in which the invention made by the present inventors is applied to the flash memory which belongs to the field of application corresponding to the background of the invention. The present invention is not limited to it. The present invention can widely be used in a semiconductor memory having nonvolatile storage or memory elements wherein voltages are applied to change their threshold voltages, thereby storing information.

An advantageous effect obtained by a typical one of the inventions disclosed in the present application will be described in brief as follows:

According to the present invention, an electrically programmable erasable nonvolatile memory device is capable of effecting writing and verifying or the like on each memory element which stores therein trimming information, substitutional information, etc. without providing a dedicated circuit, and avoiding a decrease in storage capacity available for a user and misrewriting of data by a user.

What is claimed is:

1. A nonvolatile memory comprising:
   a nonvolatile memory array comprising a first area and a second area; and
   a control circuit,
   wherein said nonvolatile memory array includes a plurality of memory cells each of which belongs one of said first area or said second area,
   wherein said control circuit performs programming and reading in said first area,
   wherein in said programming, said control circuit is adapted to store same data within first memory cells in said first area and within second memory cells in said first area,
   wherein storing of said same data within said first memory cells is carried out before storing of said same data within said second memory cells, and
   wherein in said reading, said controller circuit is adapted to read said same data from said first memory cells and from said second memory cells at once.

2. A nonvolatile memory according to claim 1,
   wherein said memory array includes a first address decoder and a second address decoder,
   wherein said first address decoder decodes an address for accessing said first memory area, and
   wherein said second address decoder decodes an address received from outside of said nonvolatile memory for accessing said second memory area.

3. A nonvolatile memory according to claim 2, wherein said address for accessing said first memory area is generated in said nonvolatile memory.

4. A nonvolatile memory according to claim 1,
   wherein said nonvolatile memory array includes a plurality of word lines each of which connects to corresponding ones of said memory cells, and
   wherein a first of said plurality of word lines connects to said first memory cells and a second of said plurality of word lines connects to said second memory cells.

5. A nonvolatile memory according to claim 4, wherein said first area is arranged in said memory array closed at address terminals.

6. A nonvolatile memory according to claim 4,
   wherein said programming to said first memory cells and said second memory cells is capable of being performed after packaging.

7. A nonvolatile memory according to claim 6, wherein said data includes rescue data.

8. A nonvolatile memory according to claim 6, wherein said data includes trimming data.

* * * * *